United States Patent
Yeh

(10) Patent No.: US 10,468,163 B1
(45) Date of Patent: Nov. 5, 2019

(54) COPPER FILM WITH BURIED FILM RESISTOR AND PRINTED CIRCUIT BOARD HAVING THE SAME

(71) Applicant: FLEX TEK CO., LTD., Taoyuan (TW)

(72) Inventor: Tsung-Her Yeh, Taoyuan (TW)

(73) Assignee: FLEX TEK CO., LTD. (TW)

( * ) Notice: Subject to any disclaimer, the term of this patent is extended or adjusted under 35 U.S.C. 154(b) by 0 days.

(21) Appl. No.: 16/292,618

(22) Filed: Mar. 5, 2019

(30) Foreign Application Priority Data

Oct. 15, 2018 (TW) .............................. 107136228 A

(51) Int. Cl.
   *H01C 7/00* (2006.01)
   *H05K 1/16* (2006.01)
   *H01C 17/00* (2006.01)
   *H05K 1/09* (2006.01)
   *H05K 1/02* (2006.01)

(52) U.S. Cl.
   CPC ............ *H01C 7/006* (2013.01); *H01C 17/003* (2013.01); *H05K 1/09* (2013.01); *H05K 1/167* (2013.01); *H05K 1/028* (2013.01)

(58) Field of Classification Search
   CPC ........ H01C 7/006; H01C 17/003; H05K 1/09; H05K 1/167; H05K 1/028
   See application file for complete search history.

(56) References Cited

U.S. PATENT DOCUMENTS

| | | | | |
|---|---|---|---|---|
| 3,864,825 A | * | 2/1975 | Holmes | H01C 7/006 29/621 |
| 5,151,676 A | * | 9/1992 | Sato | H01P 1/268 333/22 R |
| 6,034,411 A | * | 3/2000 | Wade | H01L 28/10 257/536 |
| 6,317,023 B1 | * | 11/2001 | Felten | H05K 1/162 174/259 |
| 6,542,379 B1 | * | 4/2003 | Lauffer | H01F 17/0033 174/260 |
| 6,622,374 B1 | * | 9/2003 | Wang | H01C 7/18 29/610.1 |
| 9,320,135 B2 | * | 4/2016 | Kosowsky | H05K 1/0254 |
| 2003/0154592 A1 | * | 8/2003 | Felten | H01C 7/003 29/610.1 |
| 2005/0175385 A1 | * | 8/2005 | Cho | B23K 26/351 400/209 |
| 2011/0211289 A1 | * | 9/2011 | Kosowsky | H01L 27/0288 361/91.1 |

* cited by examiner

Primary Examiner — Kyung S Lee

(57) ABSTRACT

Disclosures of the present invention mainly describe a copper film with buried film resistor. In the present invention, Ni, Cr, W, Ni-based compound, W-based compound, Ni-based alloy, or W-based alloy are adopted for the manufacture of a resistor layer, and a copper layer is processed to the copper film 1 with buried film resistor by being integrated with the resistor layer. Particularly, the resistor layer, formed on the copper layer through sputter-coating process, is able to show the lowest resistance less than or equal to 5 Ω/sq. Moreover, the use of sputter-coating technology is helpful in reduction of industrial waste water. In addition, at least one electronic circuit having at least one film resistor can be formed on a printed circuit board comprising the above-mentioned copper film by just needing to complete two times of photolithography processes on the printed circuit board.

20 Claims, 7 Drawing Sheets

(a)

(b)

(c)

COPPER FILM WITH BURIED FILM RESISTOR AND PRINTED CIRCUIT BOARD HAVING THE SAME

BACKGROUND OF THE INVENTION

1. Field of the Invention

The present invention relates to the technology field of thin film resistors, and more particularly to a copper film with buried film resistor and a printed circuit board having the same.

2. Description of the Prior Art

Engineers skilled in any one of technology of electronic engineering, computer engineering and electrical engineering certainly have the experience to make a circuit pattern on a printed circuit board (PCB) by themselves. There are several steps for making the circuit pattern on the PCB. First of all, it transfers a circuit layout from a substrate sheet to one surface of the PCB by lithography process. Subsequently, a developing process, an etching process and a stripping process are applied to the PCB in turns, so as to complete the fabrication of the circuit pattern on the PCB. Consequently, it is further disposed several pre-determined electronic chips and elements on the circuit pattern for constructing an integrated circuit on the PCB. The aforesaid pre-determined electronic chips and elements comprise amplifiers, microprocessor (s), resistors, capacitors, and inductors.

However, with the well development of various smart science and technologies, light weight, small size and thin thickness have become the fundamental characteristics of portable electronic devices. It is understood that, there is merely a limited space for disposing or arranging necessary PCB, electronic chips and elements in one portable electronic device having characteristics of small size and thin thickness, and that causes a major issue for both the electronics manufacturing plants and electronics assembly plants.

Accordingly, one solution developed by the electronics manufacturing plants is to continuously reduce the sizes of the passive electronic components for use in the portable electronic devices. Nowadays, the passive electronic components having a specific size of 0805 (80×50 mil$^2$) are used in the manufacture of various mother boards, and the passive electronic components having a specific size of 0603 (60×30 mil$^2$) are used in the fabrication of conventionally-commercial laptop PCs. On the other hand, the passive electronic components having a specific size of 0402 (40×20 mil$^2$) are used in the manufacture of smart phones, and the passive electronic components having a specific size of 0201 (20×10 mil$^2$) are used in the fabrication of commercial tablet PCs. It is extrapolated that, there may be a solid obstacle occurring on the road of continuous shrinking the size of the passive electronic components. For above reasons, technology for forming embedded passive components in a PCB is noticed again in recent years. Technology for making the embedded passive components is firstly disclosed by U.S. Pat. No. 5,151,676, and the embedded passive component is called film resistance terminator. FIG. 1 shows a cross-sectional diagram of the conventional film resistance terminator. From FIG. 1, it is understood that the film resistance terminator 1' comprises a copper film 11' and a thin resistor layer 12' forming on one surface of the copper film 11'. The thin resistor layer 12' is made of Ni—P compound by using electroplating process and commonly has a specific thickness less than 1 μm, and the thickness of the copper film 11' is around 36 μm.

Particularly, this film resistance terminator 1' and a substrate 10' can be further laminated to an RCCL (Resistor Copper Clad Laminate) board 2', wherein the RCCL board 2' has copper film 11' and buried thin resistor layer 12' therein. FIG. 2 shows a cross-sectional diagram of the RCCL board, and FIG. 3 is a schematic diagram for depicting a photolithography process applied to the circuit board. As diagram (a) in FIG. 3 shows, a film resistance terminator 1' and a substrate 10' is further laminated to an RCCL board 2' having copper film 11' and buried thin resistor layer 12' therein, wherein the substrate 10' is made of a dielectric material, and the said dielectric material can be a flexible material such as PET or a solid substrate like fiberglass.

Moreover, from diagrams (a) and (b) in FIG. 3, it is understood that a step 1 and a step 2 of the photolithography process of the RCCL board 2' are executed to form a first photoresistor 13' on the copper film 11', and making a first patterned photoresistor 13a' on the copper film 11' after an exposure process and a development process are applied to the first photoresistor 13' in turns. Subsequently, as diagrams (c) and (d) in FIG. 3 show, a step 3 and step 4 of the photolithography process of the RCCL board 2' are executed, so as to remove a specific portion of the copper film 11' that is not covered by the first patterned photoresistor 13a' through an etching process, and then remove a specific portion of the thin resistor layer 12' not covered by the first patterned photoresistor 13a' by using the etching process.

Diagram (e) in FIG. 3 depicts a step 5 of the photolithography process of the RCCL board 2'. In the step 5, a patterned copper film 11a' and a patterned thin resistor layer 12a' are provided on the substrate 10' after the first patterned photoresistor 13a' is removed. A step 6 of the photolithography process is subsequently executed so as to form a second patterned photoresistor 14' on the patterned copper film 11a', the patterned thin resistor layer 12a' and the substrate 10'. However, it is worth noting that, the second patterned photoresistor 14' shown in diagram (f) is presented by a transparent form in order to let the variations of the patterned copper film 11a' and the patterned thin resistor layer 12a' be seen during the execution of following process steps. Please continuously refer to diagram (g) in FIG. 3. A step 7 of the photolithography process of the RCCL board 2' is next executed for etching the patterned copper film 11a' via an etching opening of the second patterned photoresistor 14', so as to remove a specific portion of the patterned copper film 11a' that is not covered by the second patterned photoresistor 14'. Consequently, from diagram (h) of FIG. 3, it is found a specific portion of the patterned thin resistor layer 12a' is not covered by the patterned copper film 11a', and that is configured for being as resistor component in an electronic circuit.

Although the film resistance terminator 1' disclosed by U.S. Pat. No. 5,151,676 can be applied in the fabrication of an RCCL (Resistor Copper Clad Laminate) board 2', inventors of the present invention still find that the film resistance terminator 1' exhibits some drawbacks during the photolithography process of the RCCL board 2'. The drawbacks are summarized in follows.

(1) The RCCL board 2' is conventionally fabricated by letting a thin resistor layer 12' be formed on a matt side of a copper film 11' of a CCL (Copper Clad Laminate) board. It is worth noting that, because the thin resistor layer 12' is made of Ni—P compound by using electroplating process, the electroplating waste certainly contain high-concentration P ingredient and induce an important issue of electroplating waste treatment. On the other hand, the thin resistor layer 12' made of Ni—P compound by using electroplating process commonly show the drawbacks of film discontinuity and high surface roughness, and these drawbacks further lead the buried thin resistor layer 12' to exhibit higher surface resistance (electrical characteristics) and poor bending and stretching characteristics (mechanical characteristics). FIG. 9 shows an EBSD (electron back-scattered diffraction) image of the thin resistor layer. From FIG. 9, it is observed that the thin resistor layer 12' made by using electroplating process indeed shows the drawbacks of film discontinuity and high surface roughness.

(2) Following on from the previous descriptions, the surface resistance of the thin resistor layer 12' buried in the CCL board is commonly in a range from 10 $\Omega$/sq to 250 $\Omega$/sq. Briefly speaking, the surface resistance of the thin resistor layer 12' cannot be controlled to be less than 10 $\Omega$/sq.

(3) After using a bending test machine to complete a bending test of the film resistance terminator 1' by using a ø1 mm roller, test results report that a stripping phenomenon starts to occur between the thin resistor layer 12' and the copper film 11' after the film resistance terminator 1' is bent over 40 times. Therefore, it is understood that there is a room for improvement in joint strength between the thin resistor layer 12' and the copper film 11'.

(4) FIG. 3 has revealed that, the buried thin resistor layer 12' can be processed to at least one resistor component by applying at least three times of etching processes to the RCCL board 2'. It needs to further explain that, Ni—P compound has poor etching resistance against to commercial Cu etchant, such that the photolithography process of the RCCL board 2' described by FIG. 3 applies three times of etching processes to the RCCL board 2' for processing the buried thin resistor layer 12' to at least one resistor component, in order to make the resistor component has a good reliability and precisely meet the requirements of a demanded line width and/or a length. However, the more number of use times of the etching process applied to the RCCL board 2', the more issues and/or problems about process quality and yield accompanyingly occur.

(5) owing to the fact that the thin resistor layer 12' of the film resistance terminator 1' does not have good film continuity and surface densification, the electronic circuit having at least one resistor component, made on the RCCL board 2' by using the photolithography process, commonly has a line width and a line pitch greater than 30 μm and 30 μm and, respectively.

From above descriptions, it is clear that how to improve or redesign the structure or composition of the film resistance terminator 1' has become an important issue. In view of that, inventors of the present application have made great efforts to make inventive research and eventually provided a copper film with buried film resistor and a printed circuit board having the same.

SUMMARY OF THE INVENTION

The primary objective of the present invention is to provide a copper film with buried film resistor and a circuit board having the copper film with buried film resistor. In the present invention, Ni, Cr, W, Ni-based compound, W-based compound, Ni-based alloy, or W-based alloy are adopted for the manufacture of a first resistor layer, and a copper layer is processed to the novel copper film after being integrated with the first resistor layer, such that the said copper film is suitable for being integrated with a substrate so as to form a circuit board. It is worth explaining that, the first resistor layer is formed on the copper layer by sputter-coating process, such that the first resistor layer is able to show the lowest resistance less than or equal to 5 $\Omega$/sq because of having good film continuity and surface densification. Moreover, the use of sputter-coating technology for forming the film resistor layer is also helpful in reduction of industrial waste water. The most important thing is that, at least one electronic circuit having at least one buried film resistor can be formed on the circuit board by just needing to complete two times of photolithography processes on the circuit board having the copper film with.

In order to achieve the primary objective of the present invention, the inventor of the present invention provides an embodiment for the copper film with buried film resistor, capable of being laminated to a circuit board with a substrate, so as to make at least one electronic circuit having at least one film resistor be formed on the circuit board by just needing to complete two times of photolithography processes on the circuit board; wherein the copper film with buried film resistor comprises:

a first electrically conductive layer; and a first resistor layer, being formed on the first electrically conductive layer, and being made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials;

wherein the first resistor layer and the first electrically conductive layer have a ratio of etching time while applying an identical etchant to the first resistor layer and the first electrically conductive layer, and the ratio of etching time being greater than 2.

Moreover, for achieving the primary objective of the present invention, the inventor of the present invention provides one embodiment for the printed circuit board, comprising:

a substrate; and a copper film with buried film resistor, comprising:

a first electrically conductive layer; and a first resistor layer, being formed on the first electrically conductive layer, and being made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials;

wherein the copper film with buried film resistor is connected to one surface of the substrate by the first resistor layer thereof;

wherein the first resistor layer and the first electrically conductive layer have a ratio of etching time while applying an identical etchant to the first resistor layer and the first electrically conductive layer, and the ratio of etching time being greater than 2.

In the embodiment of the copper film with buried film resistor or the circuit board, the substrate is a flexible substrate or a solid substrate.

In the embodiment of the circuit board, further comprising a second electrically conductive layer for connecting to another one surface of the substrate.

In the embodiment of the circuit board, further comprising:

a second electrically conductive layer; and a second resistor layer, being formed on the second electrically conductive layer, and being connected to another one surface of the substrate; wherein the second resistor layer is made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials.

In the embodiment of the copper film with buried film resistor or the circuit board, both the first electrically conductive layer and the second electrically conductive layer are made of an electrically conductive material selected from the group consisting of silver (Ag), cooper (Cu), gold (Au), aluminum (Al), Ag-based compound, Cu-based compound, Au-based compound, Al-based compound, and a combination of two or more of the foregoing materials.

In the embodiment of the copper film with buried film resistor or the circuit board, the Ni-based alloy is selected from the group consisting of $Ni_{1-x}Cr_x$, $Ni_{1-x-y}Cr_xM_y$, $N_{1-x}W_x$, and $Ni_{1-x-y}W_xM_y$, wherein M is metal element.

In the embodiment of the copper film with buried film resistor or the circuit board, the Ni-based compound is selected from the group consisting of $Ni_{1-x-z}Cr_xN_z$ and $Ni_{1-x-y}W_xN_z$, wherein N is nonmetallic element.

In the embodiment of the copper film with buried film resistor or the circuit board, the W-based alloy is selected from the group consisting of $W_{1-x}Cr_x$ and $W_{1-x-y}Cr_xM_y$, wherein M is selected from the group consisting of cooper (Cu), molybdenum (Mo), vanadium (V), tungsten (W), iron (Fe), aluminum (Al), and titanium (Ti).

In the embodiment of the copper film with buried film resistor or the circuit board, the W-based compound is selected from the group consisting of $W_{1-x-z}Cr_xN_z$, wherein N is selected from the group consisting of boron (B), carbon (C), nitrogen (N), oxygen (O), and silicon (Si).

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a copper film with buried film resistor and a printed circuit board having the copper film with buried film resistor according to the present invention, embodiments of the present invention will be described in detail with reference to the attached drawings hereinafter.

First Embodiment

Figure 4:
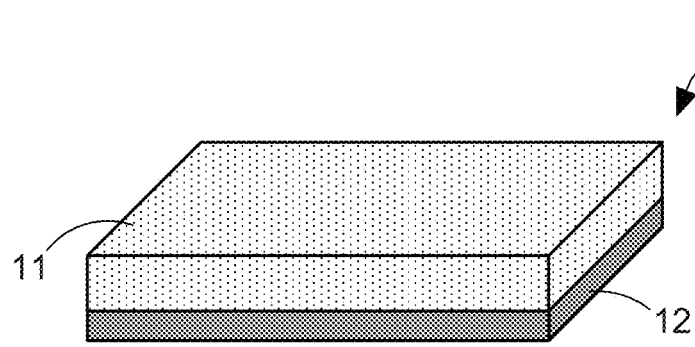
FIG. 4 shows a schematic stereo diagram of a copper film with buried film resistor according to the present invention.
Figure 5:
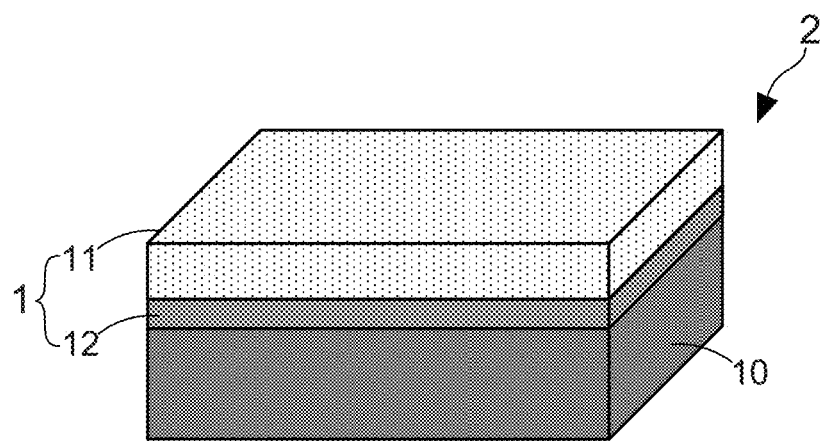
FIG. 5 shows a first schematic stereo diagram of a circuit board with the copper film with buried film resistor according to the present invention.

With reference to FIG. 4, there is shown a schematic stereo diagram of a copper film with buried film resistor according to the present invention. The copper film 1 with buried film resistor (hereinafter "copper film 1") is capable of being laminated to a circuit board 2 with a substrate 10, wherein the he substrate 10 is made of a dielectric material, and the said dielectric material can be a flexible material such as PET or a solid substrate like fiberglass. FIG. 5 shows a first schematic stereo diagram of the circuit board 2. According to the particular design of the present invention, it is able to make at least one electronic circuit having at least one film resistor be formed on the circuit board 2 by just needing to complete two times of photolithography processes on the circuit board 2. From FIG. 4 and FIG. 5, it is understood that the copper film 1 mainly comprises a first electrically conductive layer 11 and a first resistor layer 12, wherein the first electrically conductive layer 11 has a thickness in a range between 5 μm and 20 μm, and the first resistor layer 12 has a thickness thinner than 2 μm. On the other hand, the first resistor layer 12 is formed on the first electrically conductive layer 11 and made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials. From FIG. 5, it is also observed that the copper film 1 is connected to one surface of the substrate 10 by the first resistor layer 12 thereof.

Copper foil is the simplest form of the first electrically conductive layer 11, and the film resistor layer 12 is deposited onto the copper foil (i.e., the first electrically conductive layer 11) through sputter-coating process. Of course, for the purpose of shrinking the processing time of the film resistor layer 12, it is able to form one portion of the film resistor layer 12 on the copper foil via electroplating process, and then complete the fabrication of the other portions of the film resistor layer 12 through the sputter-coating process. Herein, it must particularly emphasize that, the film resistor layer 12 formed on the copper foil through sputter-coating process shows the lowest resistance less than or equal to 5 Ω/sq because of having better film compactness and continuity. Besides copper, the manufacturing material for making the first electrically conductive layer 11 is selected from the group consisting of silver (Ag), cooper (Cu), gold (Au), aluminum (Al), Ag-based compound, Cu-based compound, Au-based compound, Al-based compound, and a combination of two or more of the foregoing materials. On the other hand, exemplary materials for making the first resistor layer 12 are listed in following Table (1).

TABLE 1

| Types of the first resistor layer | Corresponding exemplary material |
| --- | --- |
| Ni-based compound | $Ni_{1-x-z}Cr_xN_z$ or $Ni_{1-x-y}W_xN_z$ |
| W-based compound | $W_{1-x-z}Cr_xN_z$ |
| Ni-based alloy | $Ni_{1-x}Cr_x$, $Ni_{1-x-y}Cr_xM_y$, $Ni_{1-x}W_x$, or $Ni_{1-x-y}W_xM_y$ |
| W-based alloy | $W_{1-x}Cr_x$ or $W_{1-x-y}Cr_xM_y$ |

All the x, y, and z are atomic ratio, and x+y+z=1. Moreover, M is metal element and selected from the group consisting of cooper (Cu), molybdenum (Mo), vanadium (V), tungsten (W), iron (Fe), aluminum (Al), and titanium (Ti). On the other hand, N is nonmetallic element and selected from the group consisting of cooper (Cu), molybdenum (Mo), vanadium (V), tungsten (W), iron (Fe), aluminum (Al), and titanium (Ti).

Figure 6:
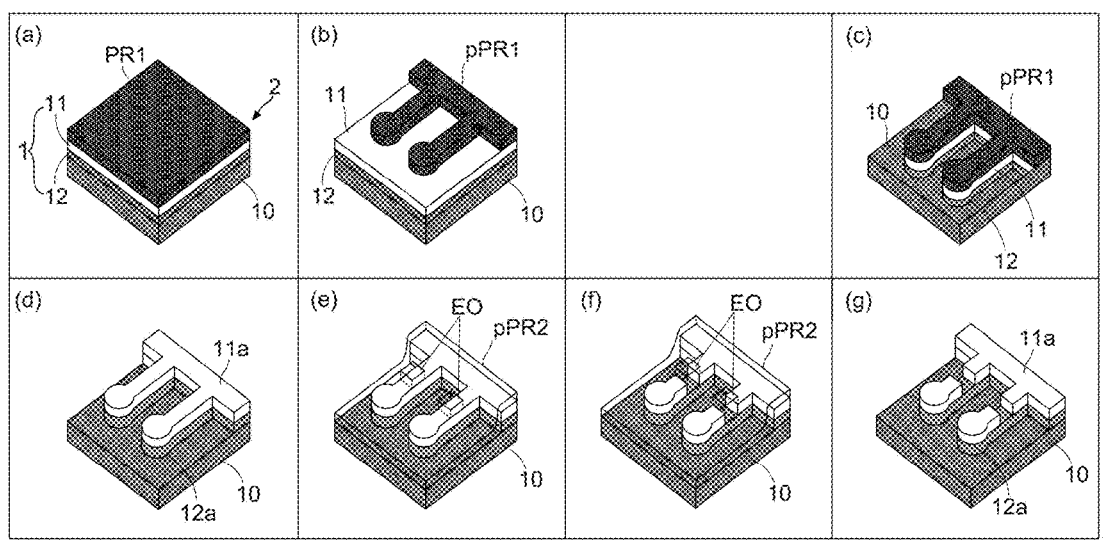
FIG. 6 shows a schematic diagram for depicting a photolithography process applied to the circuit board.

According to the particular design of the present invention, the first resistor layer 12 and the first electrically conductive layer 11 have a ratio of etching time while applying an identical etchant to the first resistor layer 11 and the first electrically conductive layer 12, and the ratio of etching time is greater than 2. By such particular arrangement, after just completing two times of photolithography processes on the circuit board 2 having the copper film 1, at least one electronic circuit having at least one film resistor is formed on the circuit board 2. FIG. 6 shows a schematic diagram for depicting the photolithography process applied to the circuit board 2. As diagram (a) in FIG. 6 shows, the circuit board 2 comprises one substrate 10 provided with a copper film 1 thereon, wherein the copper film 1 comprises a copper foil (i.e., the first electrically conductive layer 11) and a first resistor layer 12. The first resistor layer 12 is formed on the copper foil and made of $Ni_{0.97}Cr_{0.03}$. When using an identical etchant to apply an etching process to the copper foil and the $Ni_{0.97}Cr_{0.03}$ alloy (i.e., the first resistor layer 12), the copper foil and the $Ni_{0.97}Cr_{0.03}$ alloy can be totally removed by the etchant after the etching process is continuously executed for 5 seconds and 300 seconds, respectively. Therefore, the $Ni_{0.97}Cr_{0.03}$ alloy and the copper foil have a ratio of etching time of at least 60.

Moreover, from diagrams (a) and (b) in FIG. 6, it is understood that a step 1 and a step 2 of the photolithography process of the circuit board 2 are executed to form a first photoresistor PR1 on the copper foil (i.e., the first electrically conductive layer 11), and making a first patterned photoresistor pPR1 on the copper foil after an exposure process and a development process are applied to the first photoresistor PR1 in turns. Subsequently, diagram (c) shows that a step 3 is executed, so as to simultaneously remove a specific portion of the copper foil and the resistor layer 12 not covered by the first patterned photoresistor pPR1 through an identical etching process. Furthermore, diagram (d) of FIG. 6 shows that a step 4 is subsequently executed for removing the first patterned photoresistor pPR1, such that a first patterned copper foil (i.e., the first electrically conductive layer 11) 11a and a first patterned resistor layer 12a are formed on the substrate 10.

Figure 3:
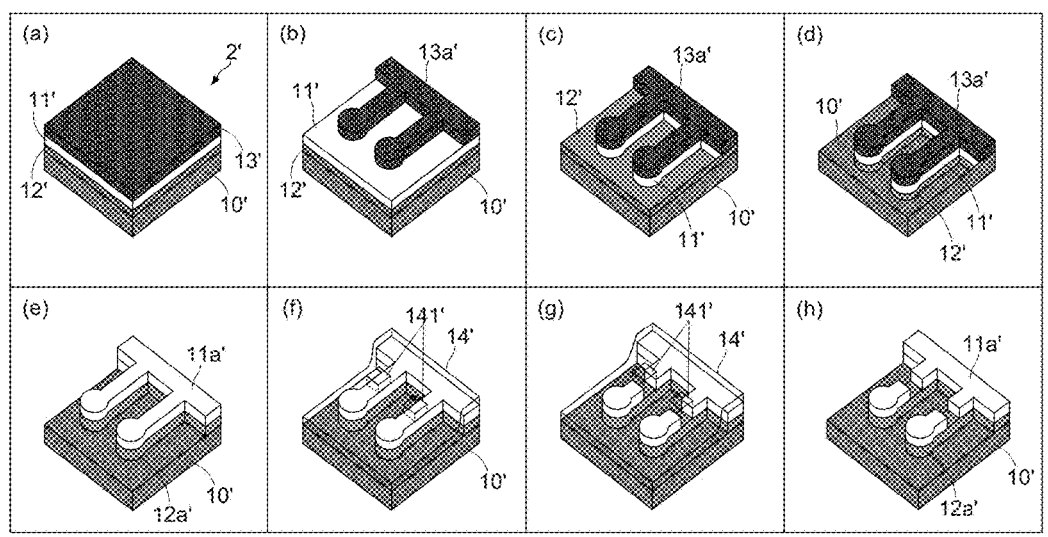
FIG. 3 shows a schematic diagram for depicting a photolithography process applied to the circuit board.

Next, a step S5 is executed for forming a second patterned photoresistor pPR2 on the patterned copper foil 11a, the patterned first resistor layer 12a and the substrate 10. However, it is worth noting that, the second patterned photoresistor pPR2 shown in diagram (e) of FIG. 6 is presented by a transparent form in order to let the variations of the patterned copper foil 11a and the patterned resistor layer 12a be seen during the execution of following process steps. Please continuously refer to diagrams (e) and (f) in FIG. 3.

A step 7 of the photolithography process of the circuit board 2 is next executed for etching the patterned copper foil 11a via an etching opening EO of the second patterned photoresistor pPR2, so as to remove a specific portion of the patterned copper foil 11a that is not covered by the second patterned photoresistor pPR2. Consequently, from diagram (g) of FIG. 6, it is found a specific portion of the patterned first resistor layer 12a is not covered by the patterned copper foil 11a, and that is configured for being as resistor component in an electronic circuit.

Second Embodiment

Figure 7:
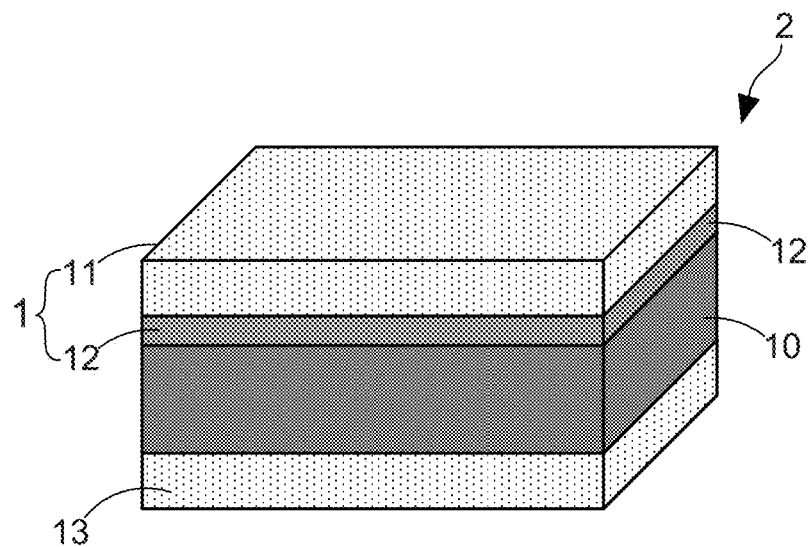
FIG. 7 shows a second schematic stereo diagram of the circuit board with the copper film with buried film resistor.

With reference to FIG. 7, there is shown a second schematic stereo diagram of the circuit board with the copper film with buried film resistor. After comparing FIG. 7 with FIG. 5, it is found that the second embodiment of the circuit board 2 is a double layer PCB, which further comprises a second electrically conductive layer 13. From FIG. 7, it is clear that the second electrically conductive layer 13, opposite to the first electrically conductive layer 11, is connected to another one surface of the substrate 10.

Third Embodiment

Figure 8:
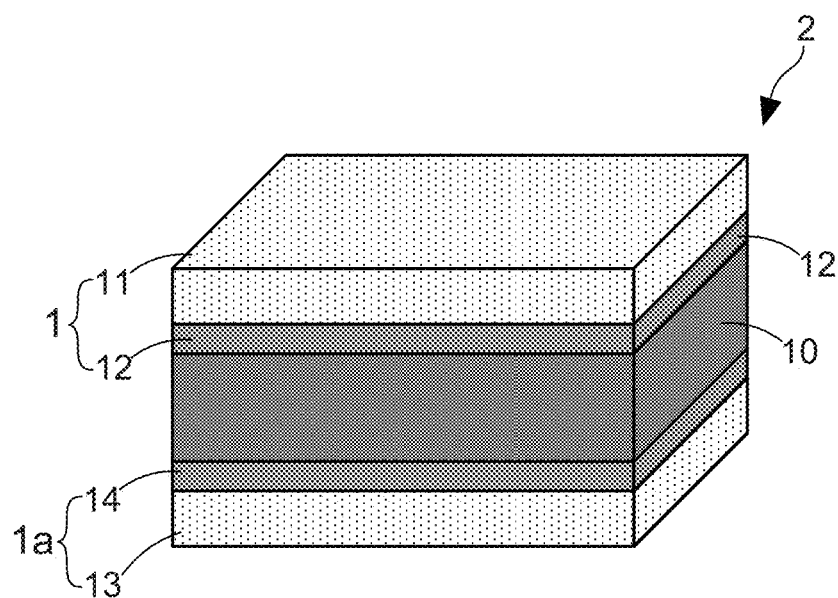
FIG. 8 shows a third schematic stereo diagram of the circuit board with the copper film with buried film resistor.

With reference to FIG. 8, there is shown a s third schematic stereo diagram of the circuit board with the copper film with buried film resistor. After comparing FIG. 8 with FIG. 5, it is found that the third embodiment of the circuit board 2 is also a double layer PCB, which further comprises another one coil film 1 consisting of a second electrically conductive layer 13 and a second resistor layer 14. From FIG. 8, it is clear that the second electrically conductive layer 13, opposite to the first electrically conductive layer 11, is connected to another one surface of the substrate 10. Moreover, the second resistor layer 14 is formed on the second electrically conductive layer 13 through sputter-coating process. In the third embodiment, both the first resistor layer 12 and the second resistor layer 14 are made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials.

Experiment

Figure 1:
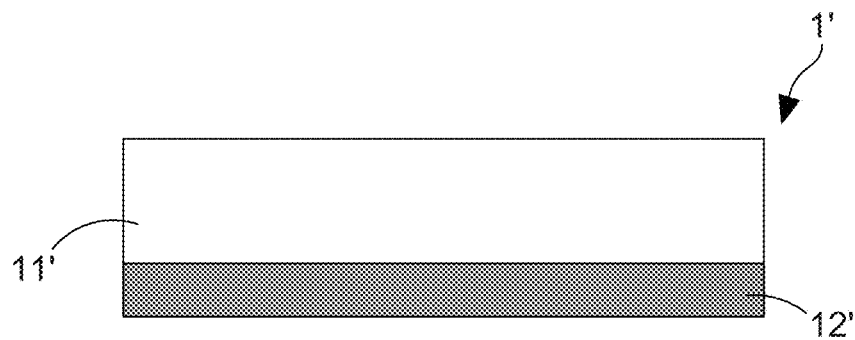
FIG. 1 shows a cross-sectional diagram of the conventional film resistance terminator.
Figure 2:
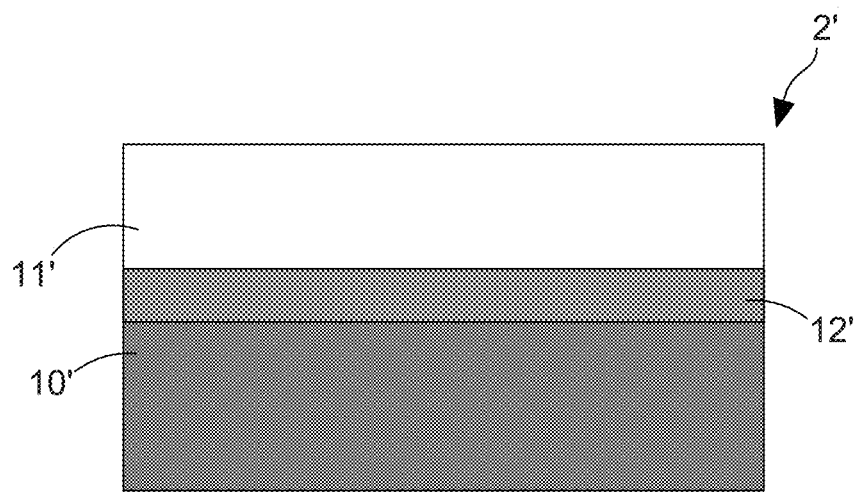
FIG. 2 shows a cross-sectional diagram of a RCCL board.
Figure 9:
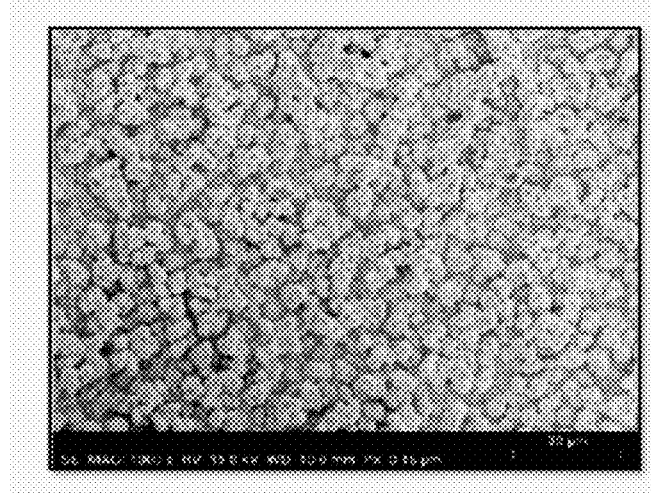
FIG. 9 shows an EBSD (electron back-scattered diffraction) image of a thin resistor layer of a film resistance terminator disclosed by U.S. Pat. No. 5,151,676.
Figure 10:
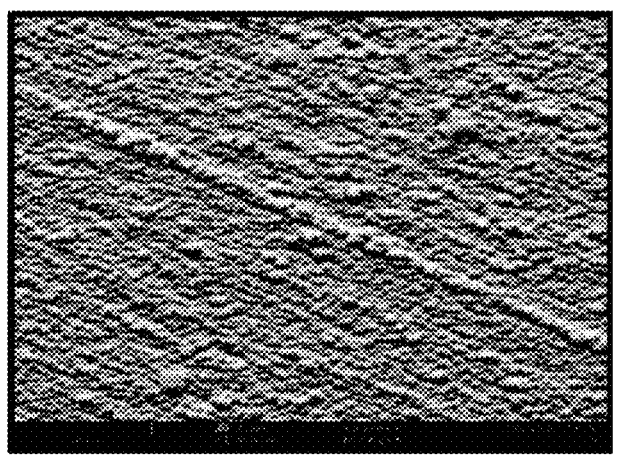
FIG. 10 shows an EBSD image of a first resistor layer of the copper film with buried film resistor proposed by the present invention.

For proving the copper film 1 with buried film resistor can indeed exhibit outstanding properties superior than that of the film resistance terminator 1' (as shown in FIG. 1) disclosed by U.S. Pat. No. 5,151,676, inventors of the present invention have made related samples of the copper film 1 and the film resistance terminator 1'. FIG. 9 shows an EBSD (electron back-scattered diffraction) image of a thin resistor layer 12' of the film resistance terminator 1', and FIG. 10 shows an EBSD image of the first resistor layer 12 of the copper film 1. The thin resistor layer 12' made of Ni—P compound by using electroplating process commonly show the drawbacks of film discontinuity and high surface roughness, and these drawbacks further lead the buried thin resistor layer 12' to exhibit higher surface resistance (electrical characteristics) and poor bending and stretching characteristics (mechanical characteristics). From FIG. 9, it is observed that the thin resistor layer 12' made by using electroplating process indeed shows the drawbacks of film discontinuity and high surface roughness. On the contrary, the first resistor layer 12 (i.e., the $Ni_{0.97}Cr_{0.03}$ layer) is formed on the copper foil (i.e., the first electrically conductive layer 11) through sputter-coating process, that makes the $Ni_{0.97}Cr_{0.03}$ layer shows the lowest resistance less than or equal to 5 Ω/sq because of having good film continuity and surface densification.

Figure 11:
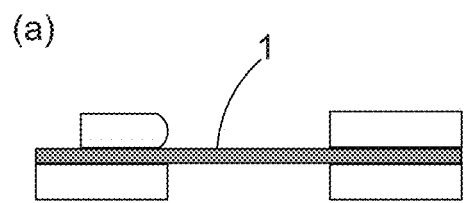
FIG. 11 shows a schematic diagram for depicting a process flow of a bending test applied to the circuit board.
Figure 11:
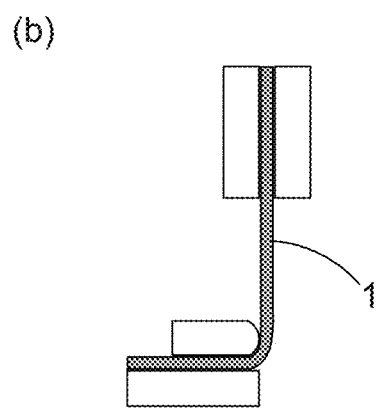
Figure 11:
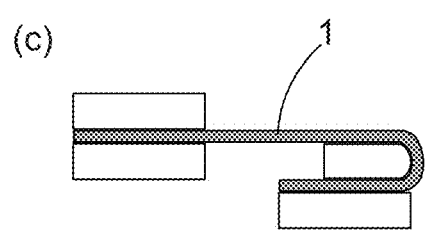

FIG. 11 shows a schematic diagram for depicting a process flow of a bending test applied to the circuit board. There are two bending tests applied to the copper film 1 proposed by the present invention. In first bending test, diagrams (a) and (b) depict that a bending test machine is used to bend the copper film 1 from 0 degree to 90 degree by using a 04 mm roller. Moreover, diagrams (b) and (c) further depict that the bending test machine is continuously used to bend the copper film 1 from 90 degree to 180 degree by using the 04 mm roller.

Please refer to FIG. 11 again. In second bending test, diagrams (a) and (b) depict that a bending test machine is used to bend the copper film 1 from 0 degree to 90 degree by using a 08 mm roller. Moreover, diagrams (b) and (c) further depict that the bending test machine is continuously used to bend the copper film 1 from 90 degree to 180 degree by using the 08 mm roller. Experimental data of the two bending tests are integrated in following Table (2).

TABLE 2

| Test items | Resistance of the first resistor layer (i.e., the $Ni_{0.97}CR_{0.03}$ layer) (ohm) | |
| --- | --- | --- |
| | Measured before the bending test | Measured after the copper film 1 has been bent for 1000 times |
| First bending test (ø4 mm bending diameter) | 125 | 125 |
| Second bending test (ø8 mm bending diameter) | 123 | 123 |

Therefore, test results of Table (2) report that, by forming the first resistor layer 12 onto the copper foil (i.e., the first electrically conductive 11) through sputter-coating process, the copper foil and the first resistor layer 12 made of metal, metal alloy or metal compound certainly have strong joint strength between each other. Therefore, it is understood that the copper film 1 of the present invention should have an excellent reliability.

Therefore, through above descriptions, the copper film with buried film resistor and the printed circuit board having the same have been introduced completely and clearly; in summary, the present invention includes the advantages of:

(1) In the present invention, Ni, Cr, W, Ni-based compound, W-based compound, Ni-based alloy, or W-based alloy are adopted for the manufacture of a film resistor layer 12, and a copper layer 11 is processed to a copper film 1 with buried film resistor after being integrated with the first resistor layer 12, such that the said copper film 1 proposed by the present invention is suitable for being integrated with a substrate 10 so as to form a circuit board 2. It is worth explaining that, the first resistor layer 12 is formed on the copper layer 11 through sputter-coating process, such that the first resistor layer 12 is able to show the lowest resistance less than or equal to 5 Ω/sq because of having good film continuity and surface densification.

(2) Moreover, the use of sputter-coating technology for forming the film resistor layer is also helpful in reduction of industrial waste water.

(3) The most important thing is that, at least one electronic circuit having at least one buried film resistor can be formed on the printed circuit board by just needing to complete two times of photolithography processes on the printed circuit board having the copper film with buried film resistor.

(4) Furthermore, experimental data of two bending tests have reported that, by forming the first resistor layer 12 onto the copper foil (i.e., the first electrically conductive 11) through sputter-coating process, the copper foil and the first resistor layer 12 made of metal, metal alloy or metal compound certainly have strong joint strength between each other. Therefore, it is understood that the copper film 1 of the present invention should have an excellent reliability.

(5) Since the first resistor layer 12 of the copper film 1 has good film continuity and surface densification, the electronic circuit having at least one resistor component, made on the circuit board 2 by using the photolithography process, can be easily controlled to has a line width and a line pitch smaller than 10 µm and 10 µm and, respectively.

The above description is made on embodiments of the present invention. However, the embodiments are not intended to limit scope of the present invention, and all equivalent implementations or alterations within the spirit of the present invention still fall within the scope of the present invention.

What is claimed is:

1. A copper film with buried film resistor, capable of being laminated to a circuit board with a substrate, so as to make at least one electronic circuit having at least one film resistor be formed on the circuit board by just needing to complete two times of photolithography processes on the circuit board; wherein the copper film with buried film resistor comprises:
   a first electrically conductive layer; and
   a first resistor layer, being formed on the first electrically conductive layer, and being made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials;
   wherein the first resistor layer and the first electrically conductive layer have a ratio of etching time while applying an identical etchant to the first resistor layer and the first electrically conductive layer, and the ratio of etching time being greater than 2.

2. The copper film with buried film resistor of claim 1, wherein an electrically conductive material for making the first electrically conductive layer is selected from the group consisting of silver (Ag), cooper (Cu), gold (Au), aluminum (Al), Ag-based compound, Cu-based compound, Au-based compound, Al-based compound, and a combination of two or more of the foregoing materials.

3. The copper film with buried film resistor of claim 1, wherein the first electrically conductive layer has a thickness in a range from 0.4 µm to 20 µm, and the first resistor layer has a thickness thinner than 2 µm.

4. The copper film with buried film resistor of claim 1, wherein the first resistor layer is formed on the first electrically conductive layer through a sputter-coating process.

5. The copper film with buried film resistor of claim 1, wherein the Ni-based alloy is selected from the group consisting of $Ni_{1-x}Cr_x$, $Ni_{1-x-y}Cr_xM_y$, $N_{1-x}W_x$, and $Ni_{1-x-y}W_xM_y$, wherein M is metal element.

6. The copper film with buried film resistor of claim 1, wherein the Ni-based compound is selected from the group consisting of $Ni_{1-x-z}Cr_xN_z$ and $Ni_{1-x-y}W_xN_z$, wherein N is nonmetallic element.

7. The copper film with buried film resistor of claim 5, wherein the W-based alloy is selected from the group consisting of $W_{1-x}Cr_x$ and $W_{1-x-y}Cr_xM_y$, wherein M is metal element.

8. The copper film with buried film resistor of claim 6, wherein the W-based compound is selected from the group consisting of $W_{1-x-z}Cr_xN_z$, wherein N is nonmetallic element.

9. The copper film with buried film resistor of claim 7, wherein the M is selected from the group consisting of cooper (Cu), molybdenum (Mo), vanadium (V), tungsten (W), iron (Fe), aluminum (Al), and titanium (Ti).

10. The copper film with buried film resistor of claim 8, wherein the N is selected from the group consisting of boron (B), carbon (C), nitrogen (N), oxygen (O), and silicon (Si).

11. A circuit board, comprising:
a substrate; and
a copper film with buried film resistor, comprising:
    a first electrically conductive layer; and
    a first resistor layer, being formed on the first electrically conductive layer, and being made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials;
wherein the copper film with buried film resistor is connected to one surface of the substrate by the first resistor layer thereof;
wherein the first resistor layer and the first electrically conductive layer have a ratio of etching time while applying an identical etchant to the first resistor layer and the first electrically conductive layer, and the ratio of etching time being greater than 2.

12. The circuit board of claim 11, wherein the substrate is a flexible substrate or a solid substrate.

13. The circuit board of claim 11, further comprising a second electrically conductive layer, being connected to another one surface of the substrate.

14. The circuit board of claim 11, further comprising:
a second electrically conductive layer; and
a second resistor layer, being formed on the second electrically conductive layer, and being connected to another one surface of the substrate; wherein the second resistor layer is made of a manufacturing material selected from the group consisting of Ni, Cr, W, Ni-based compound, Cr-based compound, W-based compound, Ni-based alloy, Cr-based alloy, W-based alloy, and a combination of two or more of the foregoing materials.

15. The circuit board of claim 13, wherein both the first electrically conductive layer and the second electrically conductive layer are made of an electrically conductive material selected from the group consisting of silver (Ag), cooper (Cu), gold (Au), aluminum (Al), Ag-based compound, Cu-based compound, Au-based compound, Al-based compound, and a combination of two or more of the foregoing materials.

16. The circuit board of claim 13, wherein both the first electrically conductive layer and the second electrically conductive layer have a thickness in a range from 0.4 μm to 20 μm, and the first resistor layer has a thickness thinner than 2 μm.

17. The circuit board of claim 14, wherein the Ni-based alloy is selected from the group consisting of $Ni_{1-x}Cr_x$, $Ni_{1-y}Cr_xM_y$, $Ni_{1-x}W_x$, and $Ni_{1-x-y}W_xM_y$, wherein M is metal element.

18. The circuit board of claim 14, wherein the Ni-based compound is selected from the group consisting of $Ni_{1-x-z}Cr_xN_z$ and $Ni_{1-x-y}W_xN_z$, wherein N is nonmetallic element.

19. The circuit board of claim 17, wherein the W-based alloy is selected from the group consisting of $W_{1-x}Cr_x$ and $W_{1-x-y}Cr_xM_y$, wherein M is selected from the group consisting of cooper (Cu), molybdenum (Mo), vanadium (V), tungsten (W), iron (Fe), aluminum (Al), and titanium (Ti).

20. The circuit board of claim 18, wherein the W-based compound is selected from the group consisting of $W_{1-x-z}Cr_xN_z$, wherein N is selected from the group consisting of boron (B), carbon (C), nitrogen (N), oxygen (O), and silicon (Si).

* * * * *